(12) United States Patent
Chuang et al.

(10) Patent No.: US 7,816,243 B2
(45) Date of Patent: Oct. 19, 2010

(54) SEMICONDUCTOR DEVICE AND METHOD OF FABRICATING THE SAME

(75) Inventors: Chun-Fei Chuang, Chiayi County (TW); Chien-Ting Lin, Hsinchu (TW); Che-Hua Hsu, Hsinchu County (TW); Shao-Hua Hsu, Taoyuan County (TW); Cheng-I Lin, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/372,908

(22) Filed: Feb. 18, 2009

(65) Prior Publication Data

US 2010/0207214 A1 Aug. 19, 2010

(51) Int. Cl.
*H01L 21/4763* (2006.01)
(52) U.S. Cl. .............. 438/591; 257/406; 257/407; 257/E21.637; 257/E21.639; 257/E27.064; 257/E21.067
(58) Field of Classification Search .............. 438/591, 438/184; 257/E21.625, E21.623, E21.621, 257/E21.635, E21.637, E21.639, 406, 407, 257/E27.064, E27.067
See application file for complete search history.

(56) References Cited

U.S. PATENT DOCUMENTS

| | | | |
|---|---|---|---|
| 7,109,079 B2 | 9/2006 | Schaeffer, III et al. | |
| 7,297,586 B2 * | 11/2007 | Triyoso et al. | 438/216 |
| 7,528,028 B2 * | 5/2009 | Liang et al. | 438/199 |
| 7,625,791 B2 * | 12/2009 | Tseng et al. | 438/199 |
| 2005/0098839 A1 * | 5/2005 | Lee et al. | 257/410 |
| 2007/0148838 A1 | 6/2007 | Doris et al. | |
| 2007/0210354 A1 | 9/2007 | Nabatame et al. | |
| 2008/0087808 A1 * | 4/2008 | Ledoux et al. | 250/252.1 |
| 2009/0152650 A1 * | 6/2009 | Chudzik et al. | 257/410 |

* cited by examiner

*Primary Examiner*—Caridad M Everhart
(74) *Attorney, Agent, or Firm*—J.C. Patents

(57) ABSTRACT

A semiconductor device and a method of fabricating the same are described. A substrate having a PMOS area and an NMOS area is provided. A high-k layer is formed on the substrate. A first cap layer is formed on the high-k layer in the PMOS area, and a second cap layer is formed on the high-k layer in the NMOS area, wherein the first cap layer is different from the second cap layer. A metal layer and a polysilicon layer are sequentially formed on the first and second cap layers. The polysilicon layer, the metal layer, the first cap layer, the second cap layer and the high-k layer are patterned to form first and second gate structures respectively in the PMOS and NMOS areas. First source/drain regions are formed in the substrate beside the first gate structure. Second source/drain regions are formed in the substrate beside the second gate structure.

17 Claims, 9 Drawing Sheets

SEMICONDUCTOR DEVICE AND METHOD OF FABRICATING THE SAME

BACKGROUND OF THE INVENTION

1. Field of Invention

The present invention relates to a semiconductor device and a method of fabricating the same, and more generally to a semiconductor device having dual work function metal gates and a method of fabricating the same.

2. Description of Related Art

As the dimension of a semiconductor device is getting smaller, the dimension of the gate structure is accordingly reduced. Thus, to avoid affecting the performance of the device, the thickness of the gate insulation layer has to be reduced accordingly.

Generally speaking, the gate insulation layer includes silicon oxide. A leakage current occurs when the gate insulation layer including silicon oxide becomes thinner.

To reduce the leakage current, one known method is to use a high dielectric constant (high-k) material instead of silicon oxide for forming the gate insulation layer. However, under the condition of using the gate insulation layer including a high-k material, the gate including polysilicon may react with the high-k material to generate a Fermi-level pinning, so that the threshold voltage is increased and the performance of the device is affected.

To avoid an increase in the threshold voltage caused by the reaction between the gate including polysilicon and the high-k material, one known method is to use a metal layer as a gate, and the metal layer is a so-called work function metal layer. However, when the metal layer is used as the gate, the work function of the metal layer is shifted due to the high temperature in the subsequent high-temperature processes, and thus the performance of the device is affected.

SUMMARY OF THE INVENTION

Accordingly, the present invention provides a method of fabricating a semiconductor device. In the complementary metal-oxide-semiconductor (CMOS) transistor having dual work function metal gates fabricated based on the method of the present invention, not only a shift in the work function caused from the subsequent high temperature processes but also the Fermi-level pinning effect can be avoided.

The present invention further provides a semiconductor device, which is compatible with strain engineering and can be integrated with the current fabrication processes, so that the competitiveness thereof is enhanced.

The present invention provides a method of fabricating a semiconductor device. First, a substrate having a P-type metal-oxide-semiconductor (PMOS) area and an N-type metal-oxide-semiconductor (NMOS) area is provided. Thereafter, a high-k layer is formed on the substrate. Afterwards, a first cap layer is formed on the high-k layer in the PMOS area, and a second cap layer is formed on the high-k layer in the NMOS area, wherein the first cap layer is different from the second cap layer. Further, a metal layer and a polysilicon layer are sequentially formed on the first and second cap layers. The polysilicon layer, the metal layer, the first cap layer, the second cap layer and the high-k layer are then patterned, so as to form a first gate structure in the PMOS area and a second gate structure in the NMOS area. Thereafter, first source/drain regions are formed in the substrate beside the first gate structure, and second source/drain regions are formed in the substrate beside the second gate structure.

According to an embodiment of the present invention, the method further includes forming an insulation layer on the substrate before the step of forming the high-k layer.

According to an embodiment of the present invention, the method of forming the first and second cap layers includes the following steps. First, a first cap material layer is formed on the substrate. Thereafter, the first cap material layer in the NMOS area is removed, so as to form the first cap layer on the high-k layer in the PMOS area. Afterwards, a second cap material layer is formed on the substrate. Further, the second cap material layer in the PMOS area is removed, so as to form the second cap layer on the high-k layer in the NMOS area.

According to an embodiment of the present invention, the first cap layer includes $Al_2O_3$, $Ga_2O_3$, $In_2O_3$ or $Ti_2O_3$, and the second cap layer includes $La_2O_3$, $Dy_2O_3$, $Y_2O_3$, $MgO_2$, lanthanide series elements or an oxide of an element in the lanthanide series, for example.

According to an embodiment of the present invention, the thicknesses of the first and second cap layers are respectively between about 5 and 20 angstroms, for example.

According to an embodiment of the present invention, the metal layer includes TiN, TaC, TaCNO, TaCN or TaC, for example.

According to an embodiment of the present invention, the thickness of the metal layer is between about 50 and 200 angstroms, for example.

According to an embodiment of the present invention, after the step of forming the first and second gate structures and before the step of forming the first and second source/drain regions, the method further includes forming spacers on sidewalls of the first and second gate structures According to an embodiment of the present invention, the first source/drain regions include SiGe epitaxial layers and the second source/drain regions include doped regions.

According to an embodiment of the present invention, after the step of forming the first and second source/drain regions, the method further includes forming a stress layer on the substrate to cover the PMOS area and the NMOS area The present invention further provides a semiconductor device including a substrate, a PMOS transistor and a NMOS transistor. The substrate has a PMOS area and a NMOS area. The PMOS transistor is disposed in the PMOS area and including a first gate structure and first source/drain regions. The first gate structure includes a first high-k layer, a first cap layer, a first metal layer and a first polysilicon layer sequentially disposed on the substrate. The first source/drain regions are disposed in the substrate beside the first gate structure. The NMOS transistor is disposed in the NMOS area and including a second gate structure and second source/drain regions. The second gate structure includes a second high-k layer, a second cap layer, a second metal layer and a second polysilicon layer sequentially disposed on the substrate. The second source/drain regions are disposed in the substrate beside the second gate structure. It is noted that the first cap layer is different from the second cap layer while the first metal layer is the same as the second metal layer.

According to an embodiment of the present invention, the device further includes a first insulation layer and a second insulation layer. The first insulation layer is disposed between the substrate and the first high-k layer. The second insulation layer is disposed between the substrate and the second high-k layer.

According to an embodiment of the present invention, the first cap layer includes $Al_2O_3$, $Ga_2O_3$, $In_2O_3$ or $Ti_2O_3$, and the second cap layer includes $La_2O_3$, $Dy_2O_3$, $Y_2O_3$, $MgO_2$, lanthanide series elements or an oxide of an element in the lanthanide series, for example.

According to an embodiment of the present invention, the thicknesses of the first and second cap layers are respectively between about 5 and 20 angstroms, for example.

According to an embodiment of the present invention, the metal layer includes TiN, TaC, TaCNO, TaCN or TaN, for example.

According to an embodiment of the present invention, the first and second metal layers have the same thickness between about 50 and 200 angstroms, for example.

According to an embodiment of the present invention, the device further includes spacers disposed on sidewalls of the first and second gate structures.

According to an embodiment of the present invention, the first source/drain regions include SiGe epitaxial layers and the second source/drain regions include doped regions.

According to an embodiment of the present invention, the device further includes a stress layer disposed on the substrate and covering the PMOS area and the NMOS area.

In summary, in the CMOS transistor having dual work function metal gates of the present invention, different cap layers are disposed under the two identical work function metal layers, so that the work functions can be adjusted by tuning the materials and thicknesses of the cap layers. In addition, the semiconductor device of the present invention is compatible with strain engineering and can be integrated with the current fabrication processes, so that the competitiveness thereof is enhanced.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 1A to 1I are schematic cross-section views illustrating a method of fabricating a semiconductor device according to an embodiment of the present invention.

DESCRIPTION OF EMBODIMENTS

FIGS. 1A to 1I are schematic cross-section views illustrating a method of fabricating a semiconductor device according to an embodiment of the present invention.

Figure 1A:
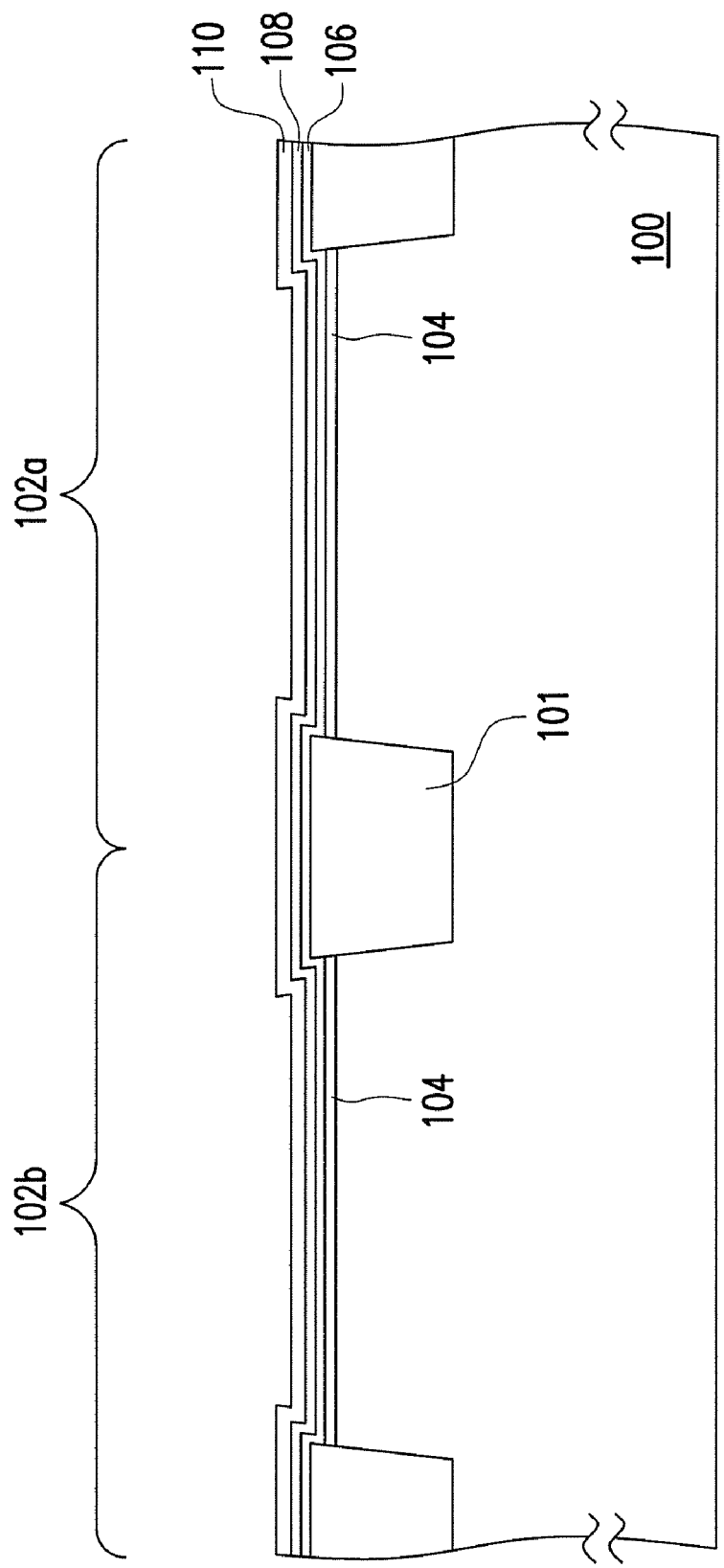

Referring to FIG. 1A, a substrate 100 is provided. The substrate 100 has a PMOS area 102a and a NMOS area 102b. The substrate is a silicon substrate, for example. The PMOS area 102a and the NMOS area 102b are separated by an isolation structure, for example. The isolation structure may be a shallow trench isolation (STI) structure.

Thereafter, a high-k layer 106 is formed on the substrate 100. The high-k layer 106 includes a dielectric material with a dielectric constant greater than 4, for example. The method of forming the high-k layer includes performing a chemical vapor deposition (CVD) process. An insulation layer 104 is optionally formed on the substrate 100 before the step of forming the high-k layer 106, so as to increase the adhesion between the high-k layer 106 and the substrate 100. The insulation layer 104 includes silicon oxide, and the forming method thereof includes performing a thermal oxide process.

Afterwards, a cap material layer 108 and a mask layer 110 are sequentially formed on the high-k layer 106. The cap material layer 108 is a metal oxide layer and the material thereof includes $Al_2O_3$, $Ga_2O_3$, $In_2O_3$ or $Ti_2O_3$, for example. The thickness of the cap material layer 108 is between about 5 and 20 angstroms, for example. The method of forming the cap material layer 108 includes performing a CVD or atomic layer deposition (ALD) process. The mask layer 110 includes silicon oxide, silicon nitride, silicon oxynitride, polysilicon or silicon, and the forming method thereof includes performing a CVD or physical vapor deposition (PVD) process.

Figure 1B:
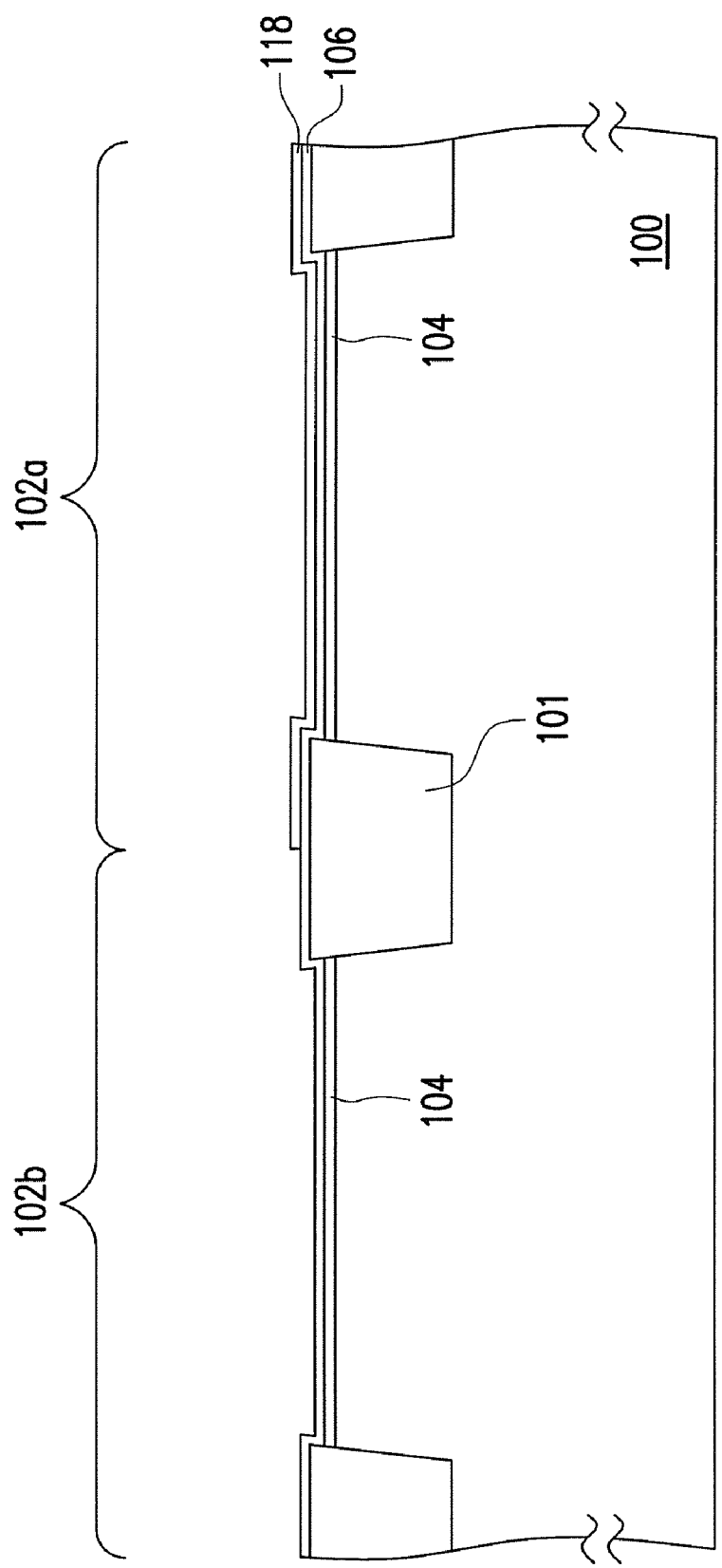

Referring to FIG. 1B, the cap material layer 108 and the mask layer 110 are patterned. The method of patterning the cap material layer 108 and the mask layer 110 includes the following steps. First, a patterned photoresist layer (not shown) is formed on the mask layer 110. Thereafter, the cap material layer 108 and the mask layer 110 in the NMOS area 102b are removed, using the patterned photoresist layer as a mask. Afterwards, a mask layer 110 in the PMOS area 102a is removed, so as to form a cap layer 118 on the high-k layer 106 in the PMOS area 102a.

Figure 1C:
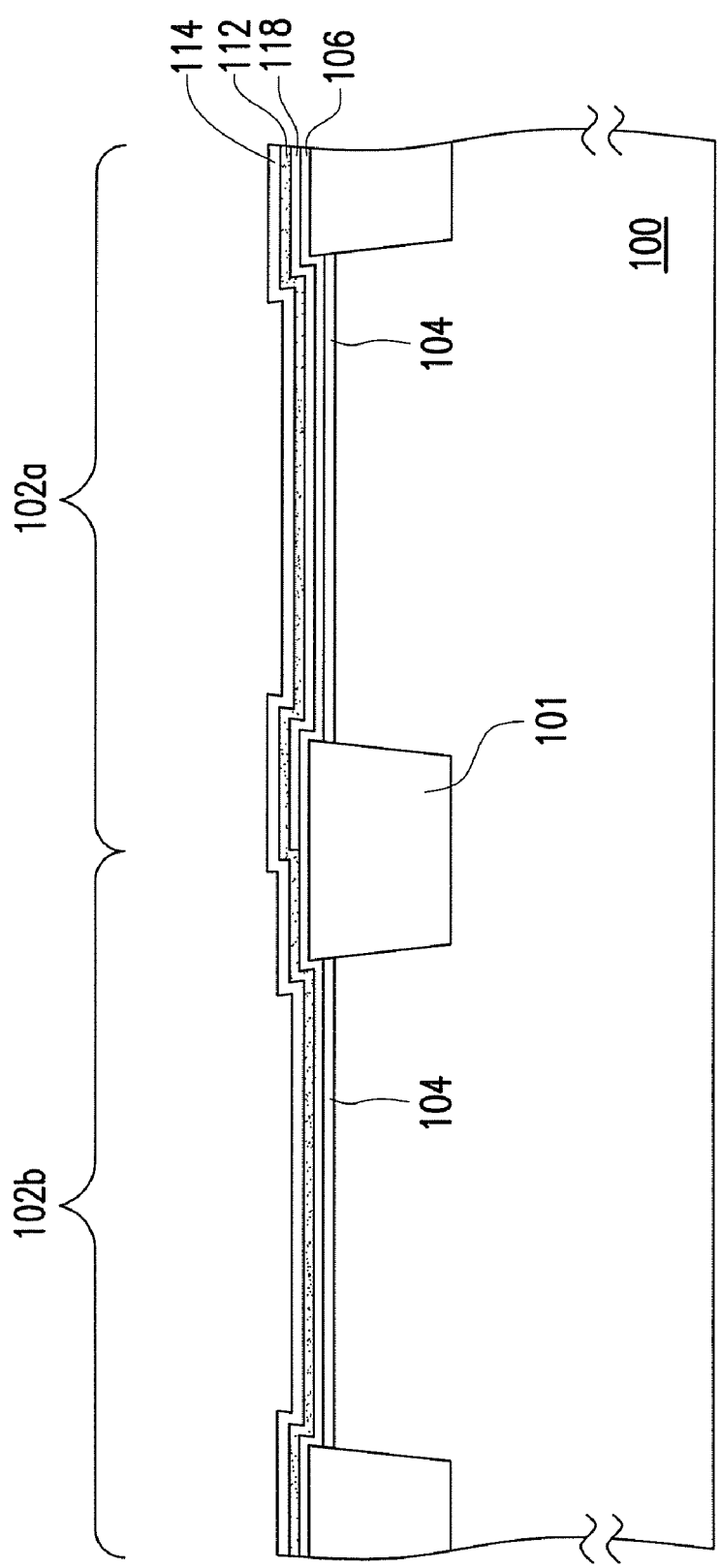

Referring to FIG. 1C, a cap material layer 112 and a mask layer 114 are sequentially formed on the substrate 100. The cap material layer 112 covers the cap layer 118 in the PMOS are 102a and the high-k layer 106 in the NMOS area 102b. The cap material layer 112 is a metal oxide layer and the material thereof includes $La_2O_3$, $Dy_2O_3$, $Y_2O_3$, $MgO_2$, lanthanide series elements or an oxide of an element in the lanthanide series, for example. The thickness of the cap material layer 112 is between about 5 and 20 angstroms, for example. The method of forming the cap material layer 112 includes performing a CVD or ALD process. The mask layer 114 includes silicon oxide, silicon nitride, silicon oxynitride, polysilicon or silicon, and the forming method thereof includes performing a CVD or PVD process.

Figure 1D:
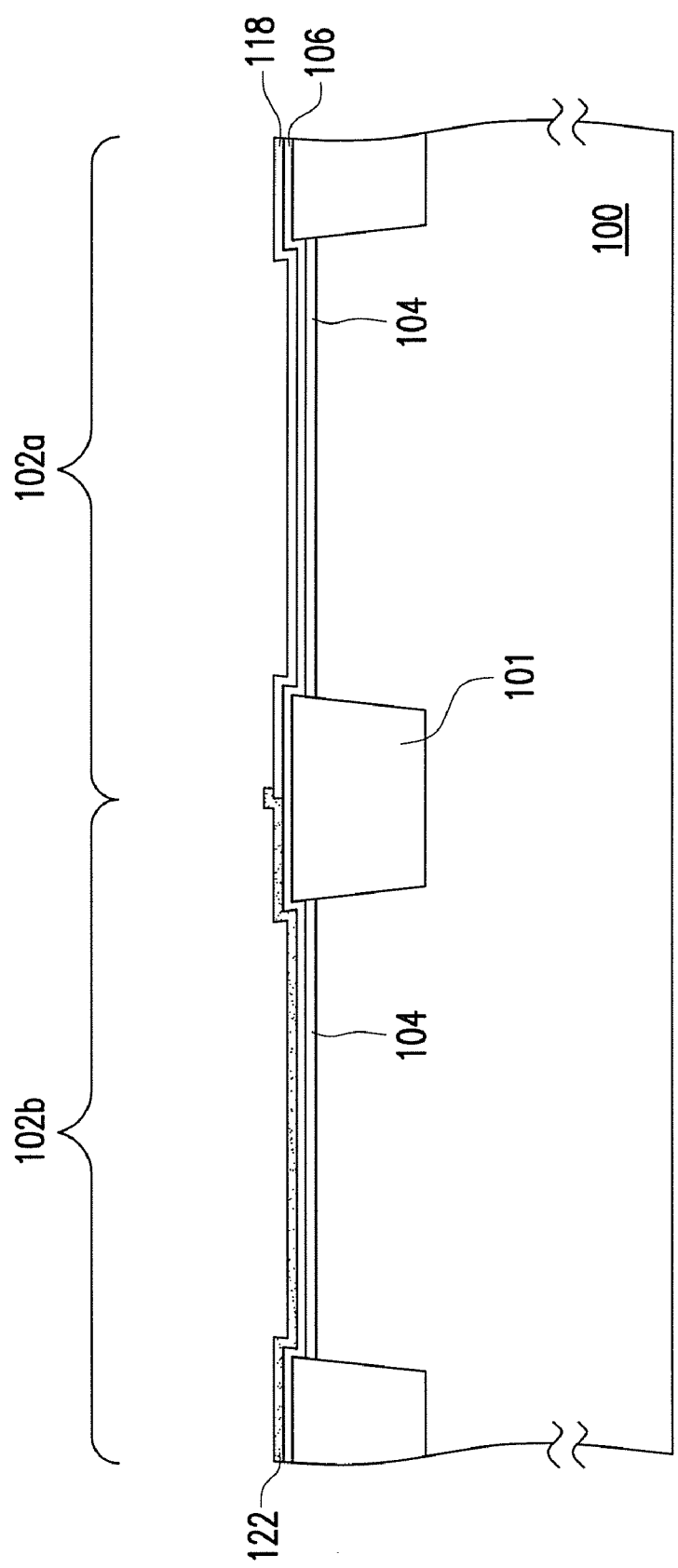

Referring to FIG. 1D, the cap material layer 112 and the mask layer 114 are patterned. The method of patterning the cap material layer 112 and the mask layer 114 includes the following steps. First, a patterned photoresist layer (not shown) is formed on the mask layer 114. Thereafter, the cap material layer 112 and the mask layer 114 in the PMOS area 102a are removed, using the patterned photoresist layer as a mask. Afterwards, a mask layer 114 in the NMOS area 102b is removed, so as to form a cap layer 122 on the high-k layer 106 in the NMOS area 102b. In this embodiment, a portion of the cap layer 122 is formed on the cap layer 118; that is, a portion of the cap layer 122 and a portion of the cap layer 118 are overlapped with each other. In another embodiment, the cap layer 122 is disconnected from the cap layer 118; that is, the cap layer 122 and the cap layer 118 are not overlapped with each other.

It is noted that during the steps of FIGS. 1A to 1D, the cap layer 118 is formed on the high-k layer 106 in the PMOS area 102a, and then the cap layer 122 is formed on the high-k layer 106 in the NMOS area 102b. However, the present invention is not limited thereto. In another embodiment (not shown), the cap layer 122 is formed on the high-k layer 106 in the NMOS area 102b, and then the cap layer 118 is formed on the high-k layer 106 in the PMOS area 102a.

Figure 1E:
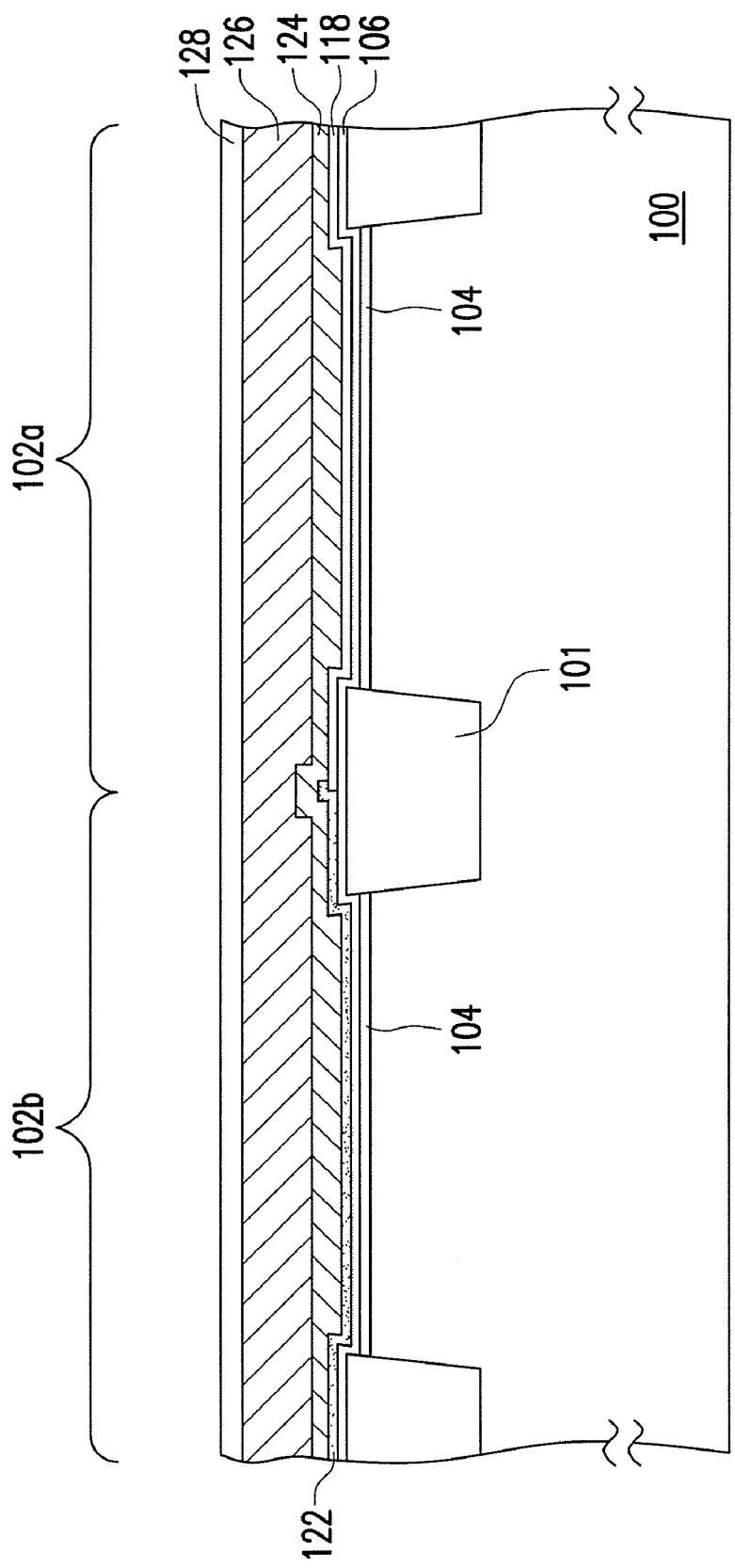

Referring to FIG. 1E, a metal layer 124, a polysilicon layer 126 and a mask layer 128 are sequentially formed on the cap layers 118 and 122. The metal layer 124 includes TiN, TaC, TaCNO, TaCN or TaN, for example. The thickness of the metal layer 124 is between about 50 and 200 angstroms, for example. The method of forming the metal layer 124 and the polysilicon layer 126 includes performing a CVD or PVD process. The mask layer 128 includes silicon oxide, silicon nitride or silicon oxynitride, polysilicon or silicon, and the forming method thereof includes performing a CVD or PVD process.

Figure 1F:
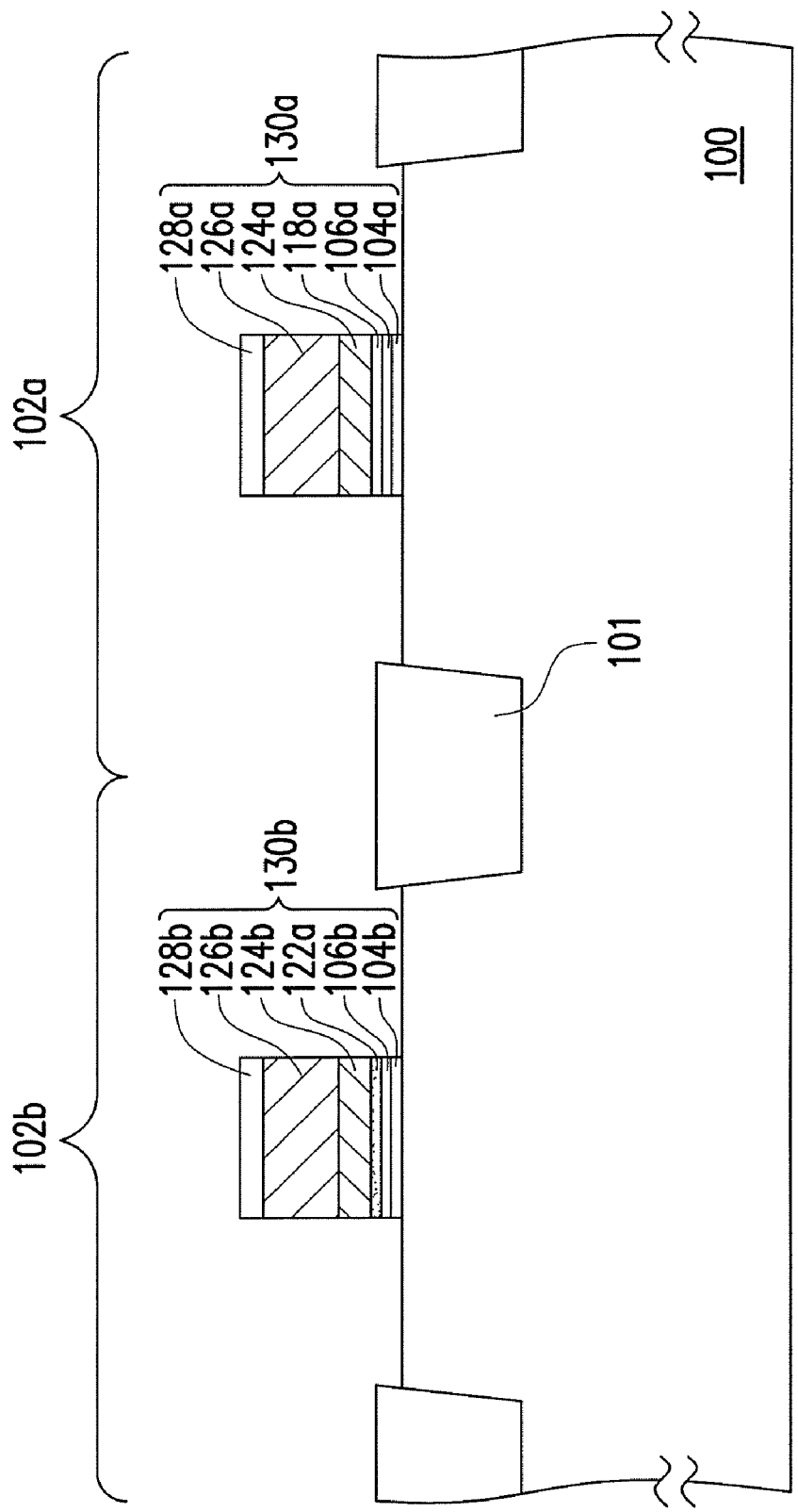

Referring to FIG. 1F, the mask layer 128, the polysilicon layer 126, the metal layer 124, the cap layer 118, the cap layer 122, the high-k layer 106 and the insulation layer 104 are patterned, so as to form a gate structure 130a in the PMOS area 102a and a gate structure 130b in the NMOS area 102b. The patterning method includes forming a patterned photoresist layer (not shown) on the mask layer 128, and then performing an etching process by using the patterned photoresist layer as a mask. The gate structure 130a includes a mask layer 128a, a polysilicon layer 126a, a metal layer 124a, a cap layer 118a, a high-k layer 106a and an insulation layer 104a. The gate structure 130b includes a mask layer 128b, a polysilicon layer 126b, a metal layer 124b, a cap layer 122a, a high-k layer 106b and an insulation layer 104b.

Figure 1G:
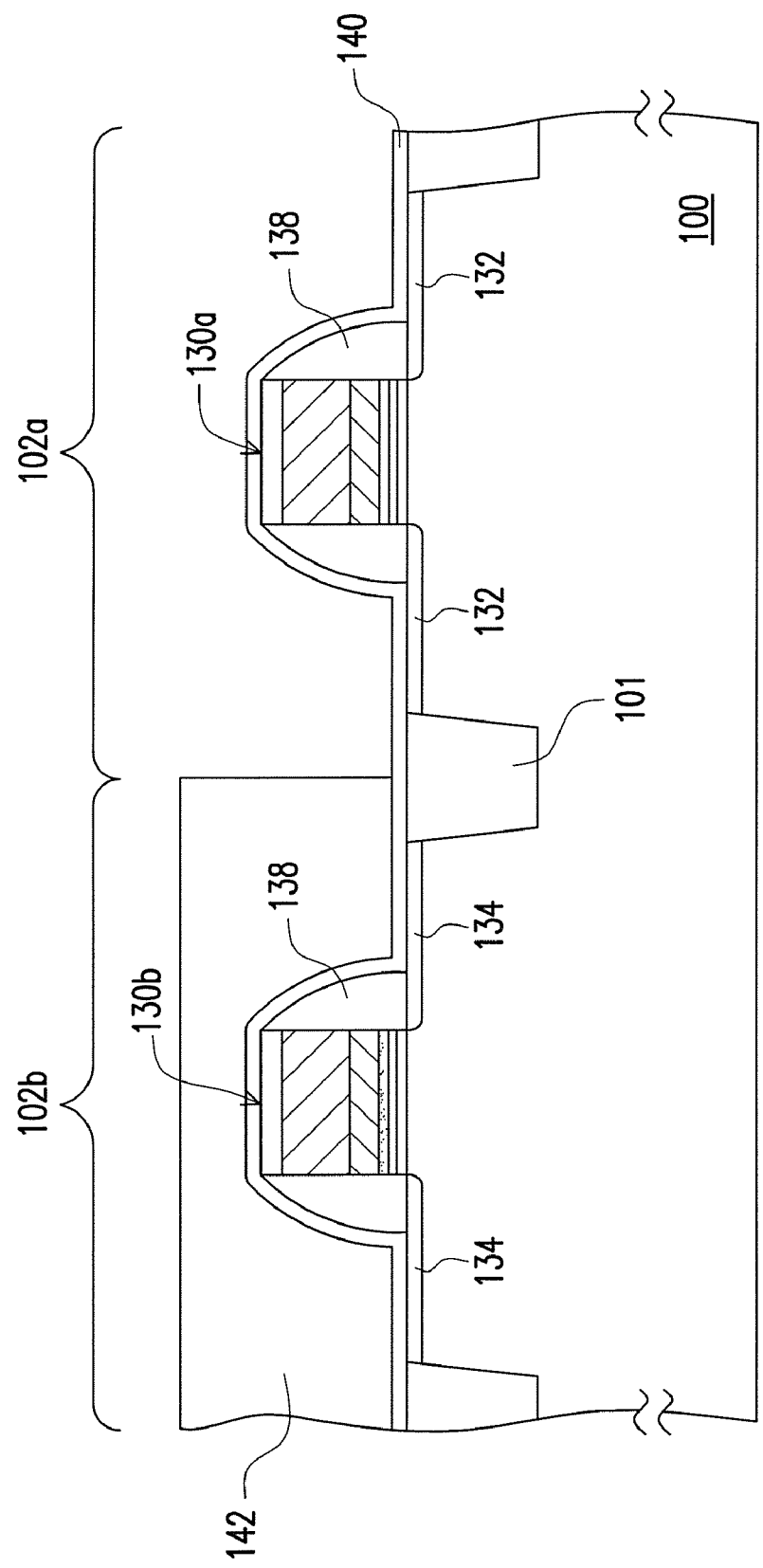

Referring to FIG. 1G, an ion implantation process is performed, using the gate structures 130a and 130b as a mask, so as to form lightly doped regions 132 and 134 in the substrate 100 respectively beside the gate structures 130a and 130b. Thereafter, spacers 138 are formed on sidewalls of the gate structures 130a and 130b. The spacers 138 include silicon nitride, for example. The method of forming the spacers 138 includes forming a spacer material layer (not shown) on the substrate 100 with a CVD process, and then performing an anisotropic etching process to remove a portion of the spacer material layer. The spacers 138 can be single-layer or multi-layer structures, and only one single layer is illustrated to represent the spacers 138 in FIG. 1G.

Figure 1H:
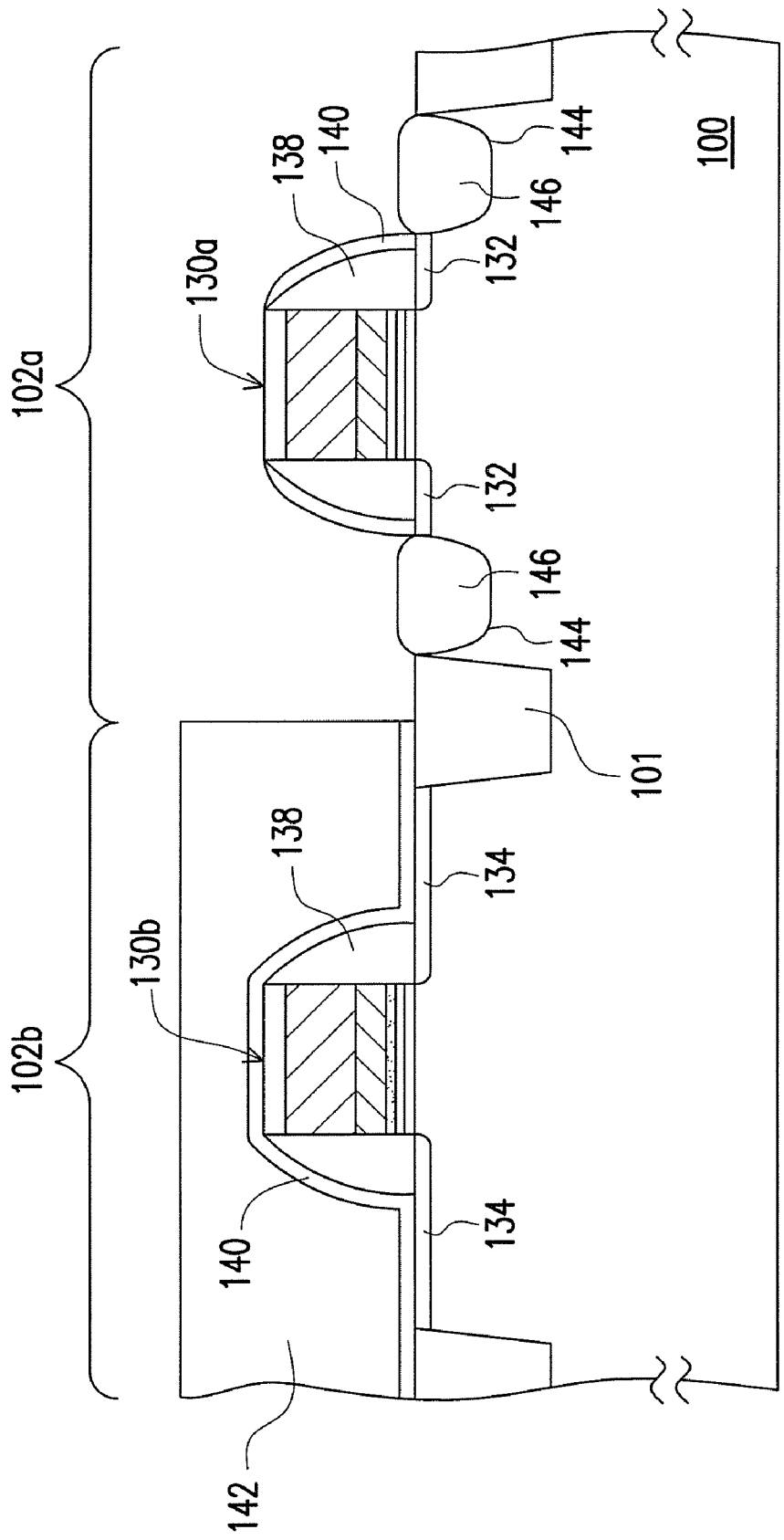
Figure 11:
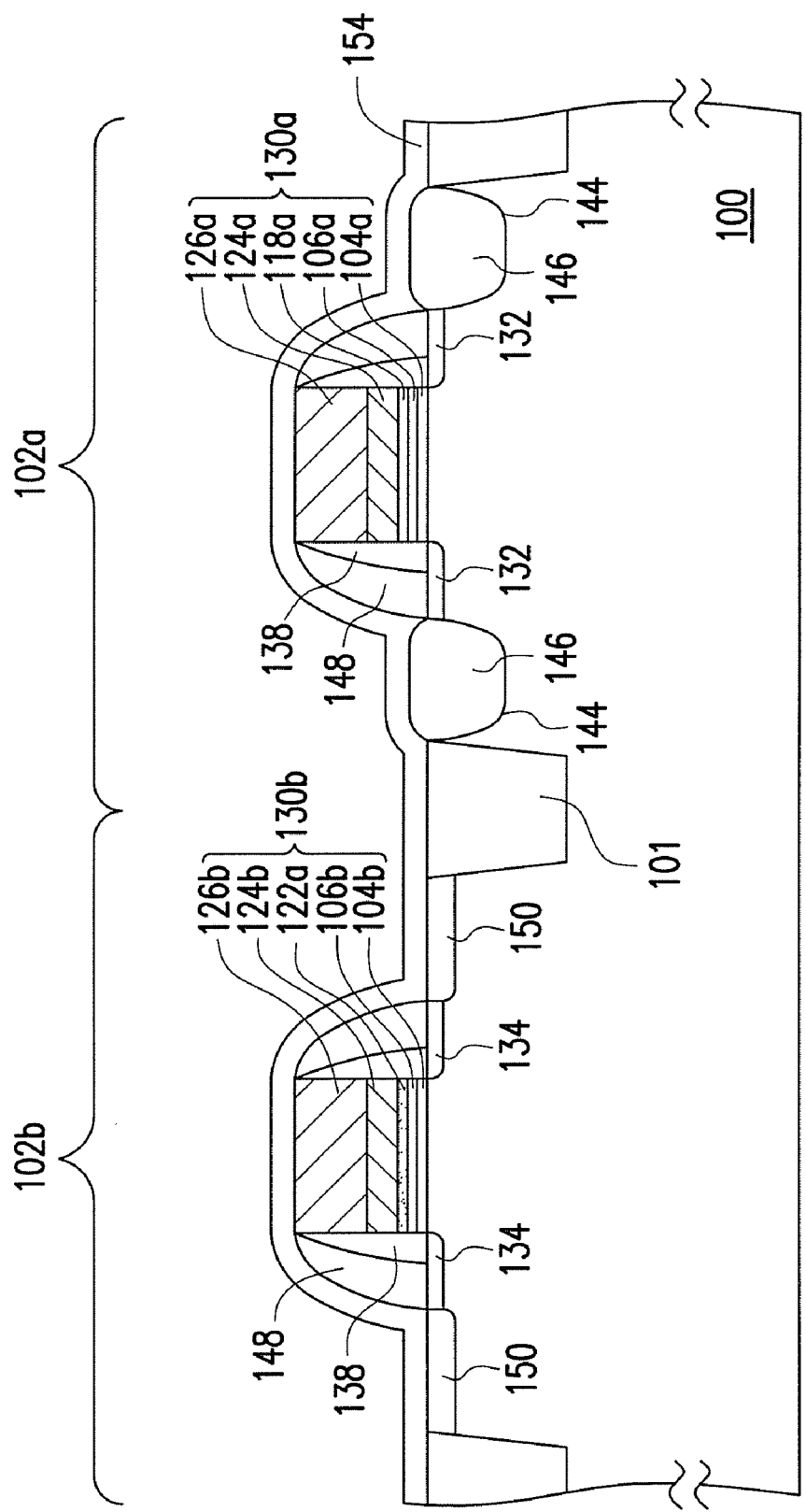

Thereafter, the channel stress of the PMOS transistor in the PMOS area 102a and that of the NMOS transistor in the NMOS area 102b are increased through strain engineering. The steps of FIGS. 1G to 1I are provided for illustrating an example of strain engineering and are not to be construed as limiting the present invention. It is appreciated by persons skilled in the art that the semiconductor device of the present invention can be integrated with other fabrication processes of strain engineering without departing from the spirit and scope of this invention. That is, the semiconductor device of the present invention is compatible with strain engineering.

Referring again to FIG. 1G, a mask layer 140 and a patterned photoresist layer 142 are sequentially formed on the substrate 100. The mask layer 140 includes silicon oxide, silicon nitride or silicon oxynitride, and the forming method thereof includes performing a CVD process. The patterned photoresist layer 142 covers the NMOS area 102b and exposes the PMOS area 102a.

Referring to FIG. 1H, an etching process is performed, using the patterned photoresist layer 142 as a mask, so as to remove the substrate 100 beside the gate structure 130a to form trenches 144. Thereafter, a selective epitaxy growth (SEG) process is performed to form silicon germanium (SiGe) epitaxial layers 146 in the trenches 144. The SiGe epitaxial layers 146 serve as the source/drain regions of the PMOS transistor. Further, the SiGe epitaxial layers 146 increase the compression stress in the channel of the PMOS transistor, so that the hole mobility is increased, and the operation speed and performance of the PMOS transistor are enhanced.

Referring to FIG. 1I, the mask layer 140 is removed. The method of removing the mask layer 140 includes performing a wet etching process. During the step of removing the mask layer 140, the mask layer 128a, the mask layer 128b and a portion of the spacers 138 are removed simultaneously. Thereafter, spacers 148 are formed on the sidewalls of the remaining spacers 138. The spacers 148 include silicon nitride, for example. Afterwards, doped regions 150 are formed in the substrate 100 beside the gate structure 130b. The method of forming the doped regions 150 includes performing an ion implantation process. The doped regions 150 serve as the source/drain regions of the NMOS transistor. Further, a stress layer 154 is formed on the substrate 100 to cover the PMOS area 102a and the NMOS area 102b. The stress layer 154 includes silicon nitride, for example. The stress layer 154 can increase the tensile stress in the channel of the NMOS transistor, so that the electron mobility is increased, and the operation speed and performance of the NMOS transistor are enhanced.

In the following, FIG. 1I is taken to illustrate the semiconductor device of the present invention. Referring to FIG. 1I, the semiconductor device of the present invention includes a substrate 100, a PMOS transistor and a NMOS transistor. The substrate has a PMOS area 102a and a NMOS area 102b. The PMOS transistor is disposed in the PMOS area 102a and including a gate structure 130a and SiGe epitaxial layers 146 serving as source/drain regions. The gate structure 130a includes an insulation layer 104a, a high-k layer 106a, a cap layer 118a, a metal layer 124 and a polysilicon layer 126a sequentially disposed on the substrate 100. The SiGe epitaxial layers 146 are disposed in the substrate 100 beside the gate structure 130a. The NMOS transistor is disposed in the NMOS area 102b and including a gate structure 130b and doped regions 150 serving as source/drain regions. The gate structure 130b includes an insulation layer 104b, a high-k layer 106b, a cap layer 122a, a metal layer 124b and a polysilicon layer 126b sequentially disposed on the substrate 100. The doped regions 150 are disposed in the substrate 100 beside the gate structure 130b. Further, the cap layer 118a is different from the cap layer 122a while the metal layer 124a is the same as the metal layer 124b.

It is noted that in the semiconductor device of the present invention, the cap layers 118a and 122a have different materials in the gate structures 130a and 130b, so that the PMOS transistor and the NMOS transistor have different work functions. In details, the work function of the PMOS transistor is decided by the metal layer 124a and the cap layer 118a disposed thereunder, and the work function is between about 4.0 eV and 4.2 eV. The work function of the NMOS transistor is decided by the metal layer 124b and the cap layer 122a disposed thereunder, and the work function is between about 4.8 eV and 5.0 eV.

Further, the metal layers 124a and 124b are formed by the same material such as TiN, so that the different work functions are substantially decided by the materials and thicknesses of the cap layers 118a and 112a. The metal layers 124a and 124b not only serve as work function metal layers, but also avoid an increase in the threshold voltage caused by the reaction between the polysilicon layers 126a and 126b and the layers disposed thereunder.

In summary, in the CMOS transistor having dual work function metal gates fabricated based on the method of the present invention, different cap layers are disposed under the two identical work function metal layers, so that the work functions can be adjusted by tuning the materials and thicknesses of the cap layers. In addition, the semiconductor device of the present invention is compatible with strain engineering and can be integrated with the current fabrication processes, so that the competitiveness thereof is enhanced.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of fabricating a semiconductor device, comprising:
providing a substrate, the substrate having a PMOS area and a NMOS area;
forming a high-k layer on the substrate;
forming a first cap layer on the high-k layer in the PMOS area and forming a second cap layer on the high-k layer in the NMOS area, wherein the first cap layer is different from the second cap layer;
forming a metal layer and a polysilicon layer sequentially on the first and second cap layers;
patterning the polysilicon layer, the metal layer, the first cap layer, the second cap layer and the high-k layer, so as to form a first gate structure in the PMOS area and a second gate structure in the NMOS area; and
forming first source/drain regions in the substrate beside the first gate structure and forming second source/drain regions in the substrate beside the second gate structure, wherein the first source/drain regions comprise SiGe epitaxial layers and the second source/drain regions comprise doped regions.

2. The method of claim 1, further comprising forming an insulation layer on the substrate before the step of forming the high-k layer.

3. The method of claim 1, wherein the step of forming the first and second cap layers comprises:
forming a first cap material layer on the substrate;
removing the first cap material layer in the NMOS area, so as to form the first cap layer on the high-k layer in the PMOS area;
forming a second cap material layer on the substrate; and
removing the second cap material layer in the PMOS area, so as to form the second cap layer on the high-k layer in the NMOS area.

4. The method of claim 1, wherein the first cap layer comprises $Al_2O_3$, $Ga_2O_3$, $In_2O_3$ or $Ti_2O_3$, and the second cap layer comprises $La_2O_3$, $Dy_2O_3$, $Y_2O_3$, $MgO_2$, lanthanide series elements or an oxide of an element in the lanthanide series.

5. The method of claim 1, wherein thicknesses of the first and second cap layers are respectively between 5 and 20 angstroms.

6. The method of claim 1, wherein the metal layer comprises TiN, TaC, TaCNO, TaCN or TaN.

7. The method of claim 1, wherein a thickness of the metal layer is between 50 and 200 angstroms.

8. The method of claim 1, further comprising forming spacers on sidewalls of the first and second gate structures after the step of forming the first and second gate structures and before the step of forming the first and second source/drain regions.

9. The method of claim 1, further comprising forming a stress layer on the substrate to cover the PMOS area and the NMOS area after the step of forming the first and second source/drain regions.

10. A semiconductor device, comprising:
a substrate, having a PMOS area and a NMOS area;
a PMOS transistor, disposed in the PMOS area and comprising:
a first gate structure, comprising a first high-k layer, a first cap layer, a first metal layer and a first polysilicon layer sequentially disposed on the substrate; and
first source/drain regions, disposed in the substrate beside the first gate structure; and a NMOS transistor, disposed in the NMOS area and comprising:
a second gate structure, comprising a second high-k layer, a second cap layer, a second metal layer and a second polysilicon layer sequentially disposed on the substrate; and
second source/drain regions, disposed in the substrate beside the second gate structure,
wherein the first cap layer is different from the second cap layer while the first metal layer is the same as the second metal layer, and
wherein the first source/drain regions comprise SiGe epitaxial layers and the second source/drain regions comprise doped regions.

11. The device of claim 10, further comprising:
a first insulation layer, disposed between the substrate and the first high-k layer; and
a second insulation layer, disposed between the substrate and the second high-k layer.

12. The device of claim 10, wherein the first cap layer comprises $Al_2O_3$, $Ga_2O_3$, $In_2O_3$ or $Ti_2O_3$, and the second cap layer comprises $La_2O_3$, $Dy_2O_3$, $Y_2O_3$, $MgO_2$, lanthanide series elements or an oxide of an element in the lanthanide series.

13. The device of claim 10, wherein thicknesses of the first and second cap layers are respectively between 5 and 20 angstroms.

14. The device of claim 10, wherein the first and second metal layer comprise TiN, TaC, TaCNO, TaCN or TaN.

15. The device of claim 10, wherein the first and second metal layers have the same thickness between 50 and 200 angstroms.

16. The device of claim 10, further comprising spacers, disposed on sidewalls of the first and second gate structures.

17. The device of claim 10, further comprising a stress layer, disposed on the substrate and covering the PMOS area and the NMOS area.

* * * * *